(12) United States Patent
Okita

(10) Patent No.: US 6,175,945 B1
(45) Date of Patent: Jan. 16, 2001

(54) REED-SOLOMON DECODER

(75) Inventor: Shigeru Okita, Tokyo (JP)

(73) Assignee: Texas Instruments Incorporated, Dallas, TX (US)

( * ) Notice: Under 35 U.S.C. 154(b), the term of this patent shall be extended for 0 days.

(21) Appl. No.: 09/074,551

(22) Filed: May 7, 1998

(30) Foreign Application Priority Data

May 7, 1997 (JP) .................................................. 9-116766

(51) Int. Cl.[7] .................................................. H03M 13/15
(52) U.S. Cl. .................................................. 714/784
(58) Field of Search .................................................. 719/784

(56) References Cited

U.S. PATENT DOCUMENTS

| 4,677,622 | * | 6/1987 | Okamoto et al. | 371/39 |
| 4,841,300 | * | 6/1989 | Yoshida et al. | 341/94 |
| 4,875,211 | * | 10/1989 | Murai et al. | 371/40.1 |
| 5,414,719 | * | 5/1995 | Iwaki et al. | 371/37.1 |

FOREIGN PATENT DOCUMENTS 63-146619 * 6/1988 (JP) .

OTHER PUBLICATIONS

Iwaki et al., "Architecture of a High Speed Reed Solomon Decoder", IEEE Transaction on Consumer Electronics, vol. 40, No. 1, pp. 75–82, Feb. 1994.*

* cited by examiner

*Primary Examiner*—Stephen Baker
(74) *Attorney, Agent, or Firm*—Bret J. Petersen; Frederick J. Telecky, Jr.

(57) ABSTRACT

A Reed Solomon decoder which can perform high-speed decoding operation without significantly increasing the circuit scale. The Reed Solomon decoder includes the following: input parameter operator 309 which generates syndrome and erasure data for a data sequence, decoding operation processing unit 304 which performs the decoding operation using the aforementioned syndrome and erasure data based on the command code indicating the prescribed decoding operation, and which generates the error data and error position data, and correction operation executor 312 which performs the correction operation using the aforementioned error data and error position data. The decoding operation processing unit 304 has an multiplier and an adder which execute the product and sum operation of the Galois field in one step.

18 Claims, 7 Drawing Sheets

REED-SOLOMON DECODER

FIELD OF THE INVENTION

This invention pertains to a type of Reed Solomon decoder that decodes Reed Solomon encoded signals used for error correction in recording media and in digital transmission.

BACKGROUND OF THE INVENTION

The Reed Solomon code (referred to as RS code hereinafter) has a high coding efficiency and a good adaptivity to error bursts, and is hence used mainly as the external code for recording media and in digital transmission.

For example, the error correction code adopted for compact discs is called CIRC correction code (Cross Interleaved Reed Solomon code), and it is a product of two RS codes combined with the interleave technique. It adopts RS (28, 24) as its external code, and RS (32, 28) as its internal code. They are called the C2 code and C1 code, respectively. For all of these codes, each RS code symbol is constructed of 1 byte, and each RS code block contains a 4-byte parity check string.

Usually, for the RS code, correction of t symbol can be performed with a check string of 2t symbols. For correction of t symbols, it is necessary to know t error positions and t error values corresponding to these errors, respectively. For the RS code, when t errors are generated, by performing the syndrome operation on the decoder side, 2t independent linear equations are obtained. When these equations are solved, there are 2t unknown parameters, and it is possible to derive the aforementioned t error positions and the aforementioned t error values corresponding to said error positions, respectively.

On the other hand, as the configuration of the product code, such as CIRC code, is handled, by adding the erasure flag to the RS-encoded block that cannot be corrected and the relatively high RS-encoded block that can be corrected in the internal RS decoding for the internal code, it is possible to correct the erasure error in the external RS decoding corresponding to the external code. The erasure symbol of the internal code with the erasure flag added to it is distributed to plural outer RS-encoded blocks by means of de-interleaving. In the erasure error correction, it is assumed that errors exist in the aforementioned erasure symbol, and the simultaneous equations obtained by the syndrome operation are solved. In solving the equations with the error positions taken as known, it is possible to derive up to 2t error values. That is, for the RS code having a check string of 2t symbols, it is possible to perform correction for errors of up to 2t symbols by executing the erasure error correction.

In the following, explanation will be made on the erasure error correction method with reference to the CIRC code as an example.

In the case of CIRC code, by adding the erasure flag to the RS decoding (C1 decoding) of the C1 code as the internal code, it is possible to perform the erasure error correction through the RS decoding (C2 decoding) of the C2 code as the external code. As both C1 code and C2 code have t=2, the C1 decoding allows up to 2 bytes of correction, and the erasure error correction of the C2 decoding allows up to 4 bytes of correction. Syndromes $s_0$–$s_3$ in the C2 decoding and error values $e_1$–$e_4$ are derived as follows.

Formula (1) below shows the code-generating polynomial $Ge(x)$ of the CIRC code.

[Mathematical Formula 1]

$$Ge(x) = \prod_{j=0}^{3}(x+\alpha^j) \qquad (1)$$

Here, $\alpha$ represents the primitive element of the Galois field. In this case, $s_0$–$s_3$ obtained through the syndrome operation from the input series are related to said $x_1$–$x_4$ and $e_1$–$e_4$ by following Formula 2.

[Mathematical Formula 2]

$$\begin{aligned} s0 &= e1+e2+e3+e4 \\ s1 &= x1\cdot e1+x2\cdot e2+x3\cdot e3+x4\cdot e4 \\ s2 &= x1^2\cdot e1+x2^2\cdot e2+x3^2\cdot e3+x4^2\cdot e4 \\ s3 &= x1^3\cdot e1+x2^3\cdot e2+x3^3\cdot o3+x4^3\cdot e4 \end{aligned} \qquad (2)$$

Here, symbol "·" represents multiplication over the Galois field, and symbol "+" represents addition over the Galois field. In the following, the mathematical operations of the elements of certain Galois fields will be shown.

Simultaneous Formulas 2 listed above are solved, and error values $e_1$–$e_4$ are derived as follows as the unknown values.

First of all, $e_4$ is obtained as represented by following Formula 3.

[Mathematical Formula 3]

$$e4 \leftarrow \frac{s3+(x1+x2+x3)\cdot s2+(x1\cdot x2+x2\cdot x3+x3\cdot x1)\cdot s1+x1\cdot x2\cdot x3\cdot s0}{(x4+x1)\cdot(x4+x2)\cdot(x4+x3)} \qquad (3)$$

$e_4$ obtained here is substituted into said Formula 2 to reconstruct the simultaneous formulas made of three formulas. That is, by noticing the fact that addition and subtraction are the same for the Galois field used in the CIRC code, correction is performed as shown in following Formula 4, and said Formula 2 as simultaneous equations are transformed to following Formula 5.

[Mathematical Formula 4]

$$s0 \leftarrow s0+e4$$

$$s1 \leftarrow s1+x4\cdot e4$$

$$s2 \leftarrow s2+x4^2\cdot e4 \qquad (4)$$

[Mathematical Formula 5]

$$\begin{aligned} s0 &= e1+e2+e3 \\ s1 &= x1\cdot e1+x2\cdot e2+x3\cdot e3 \\ s2 &= x1^2\cdot e1+x2^2\cdot e2+x3^2\cdot e3 \end{aligned} \qquad (5)$$

Solution of the simultaneous formulas is the method often adopted when the sequence is derived by manual calculation. Then, Formulas 5, as simultaneous equations, are solved to derive e3, obtaining following Formula 6.

[Mathematical Formula 6]

$$e3 \leftarrow \frac{s2 + (x1 + x2) \cdot s1 + x1 \cdot x2 \cdot s0}{(x3 + x1) \cdot (x3 + x2)} \quad (6)$$

By performing the same correction, said Formulas 5 as simultaneous equations are transformed to following Formulas 7 and 8.

[Mathematical Formula 7]

$$s0 \leftarrow s0 + e3$$
$$s1 \leftarrow s1 + x3 \cdot o3 \quad (7)$$

[Mathematical Formula 8]

$$s0 = e1 + e2$$
$$s1 = x1 \cdot e1 + x2 \cdot e2 \quad (8)$$

Also, Formulas 8 as simultaneous equations are solved to give $e_2$, and following Formula 9 is obtained.

[Mathematical Formula 9]

$$e2 \leftarrow \frac{s1 + x1 \cdot s0}{x2 + x1} \quad (9)$$

Then, the obtained $e_2$ is substituted into said Formulas 8, giving the following Formula 10.

[Mathematical Formula 10]

$$e1 \leftarrow s0 + e2 \quad (10)$$

In this way, errors $e_1$–$e_4$ are derived in sequence.

In the aforementioned method, in order to distinguish the original information and the operation performed during the applied decoding operation, symbols "=" and "←" are used to indicate the difference. That is, Formulas 3, 4, 6, 7, 9 and 10 correspond to the applied decoding operation, which requires at least 23 rounds of addition, 17 rounds of multiplication, and 3 rounds of division over the Galois field.

On the other hand, when the erasure error correction is not carried out, it is possible to perform correction up to 2 bytes in the C2 decoding (double error correction). In this case, error values $e_1$ and $e_2$ and error positions $x'_1$ and $x'_2$ are derived from syndromes $s_0$–$s_3$.

The aforementioned is the processing procedure of the decoding operation in the case of quadruple erasure error correction, that is, when the number of the erasure positions is 4.

In the following, a conventional Reed Solomon decoder will be explained.

FIG. 9 is a diagram illustrating the configuration of conventional Reed Solomon decoder 1.

As shown in FIG. 9, Reed Solomon decoder 1 has memory block 2, bus I/F block 3, and decoding operation processing unit 4.

Memory block 2 has cache memories 5, 6 and switches 7 and 8.

Switch 7 outputs the input data selectively to cache memories 5 and 6. Switch 8 outputs the content stored in cache memory 5 to correction operation executor 12.

Bus I/F block 3 has input parameter operator 9, register $B_{OUT}$ 10, binary counter 11, correction operation executor 12 and register $B_{IN}$ 13.

Decoding operation processing unit 4 has switch 14, register $G_{IN}$ 15, register $G_{OUT}$ 16, and decoding operator 17.

FIG. 10 is a diagram illustrating the time sequence of the data and structural elements in the operation of Reed Solomon decoder 1. (A) represents the input data; (B) represents the output data; (C) represents the memory state of register $B_{OUT}$ 10; (D) represents the memory state of register $B_{IN}$ 13; (E) represents the memory state of register $G_{OUT}$ 16; (F) represents the memory state of register $G_{IN}$ 15; and (G) represents the processing state of decoding operator 17.

As shown in FIG. 10, in cache memory 5 of memory block 2, when the input data pertaining to the C1 code are input/output, for the input data pertaining to the C1 code, bus I/F block 3 calculates the decoding operation input parameter in input parameter operator 9, and the correction operation is performed in correction operation executor 12. Also, in this case, in decoding operation processor 4, C2 decoding processing is performed for the input data pertaining to the C2 code.

Also, when input/output of the input data pertaining to the C2 code are performed in cache memory 6, bus I/F block 3 calculates the decoding operation input parameter in input parameter operator 9 for the input data pertaining to the C2 code, and correction operation is performed in correction operation executor 12. Also, in this case, in decoding operation processing unit 4, C1 decoding processing is performed for the input data pertaining to the C1 code.

Here, specific decoding operation input parameters include syndrome (S) and erasure position (I).

Syndrome (S) is operated by a combination of input parameter operator 9 and register $B_{OUT}$ 10.

FIG. 11 is a diagram illustrating the structure of input parameter operator 9 and register $B_{OUT}$ 10, illustrated in FIG. 9.

As can be seen from FIG. 11, input parameter operator 9 has multipliers 24–27, adders 20–23, erasure flag detector 28, and distributor 29.

Also, register $B_{OUT}$ 10 has registers 30–33 and registers 34–37.

Multipliers 24–27 are multipliers of the Galois field with a fixed value of the multiplication coefficient, and they perform multiplications of $x\alpha^0$, $x\alpha^1$, $x\alpha^2$, $x\alpha^3$ respectively.

Erasure flag detector 28 detects whether or not the erasure flag contained in the input data is "1".

Distributor 29 outputs the output of binary counter 11 which operates corresponding to the various RS symbol positions contained in the input data to one of registers 34–37 of register $B_{OUT}$ 10.

The memory result of registers 34–37 is represented by erasure position (I).

By means of the converter to be explained later, erasure position (I) is converted to the representation of the Galois field, that is, from "i" to "$\alpha^i$," in decoding operator 17 shown in FIG. 9.

More specifically, conversion is made from I={$i_1$, $i_2$, $i_e$, $i_4$} to X={$x_1$, $x_2$, $x_3$, $x_4$}.

When the quadruple dropping error correction is performed, the decoding operation corresponding to said Formulas 3, 4, 6, 7, and 10 is performed in decoding operation processing unit 4, decoding operation input parameters S={$s_0$, $s_1$, $s_2$, $s_3$} and I={$i_1$, $i_2$, $i_3$, $i_4$} from register $B_{OUT}$ 10 are converted to obtain X={$x_1$, $x_2$, $x_3$, $x_4$}, which is used to obtain decoding operation output parameters E={$e_1, e_2, e_3, e_4$} and X'=X={$x_1, x_2, x_3, x_4$}. When the dropping error correction is performed, in the aforementioned double error correction, decoding operation input parameter S={$s_0, s_1, s_2, s_3$} is used to obtain decoding operation output parameters E={$e_1, e_2$} and X'={$x'_1, x'_2$}.

In decoding operation processing unit 4, error position X or X' is converted to the exponential value, that is, from $\alpha^i$ to i by a converter to be explained later. More specifically, conversion is performed from X'=X={$x_1, x_2, x_3, x_4$} to I={$i_1, i_2, i_3, i_4$}, and from X'={$x'_1, x'_2$} to I'={$i'_1, i'_2$}.

FIG. 12 is a diagram illustrating the configuration of correction operation executor 12 and register $B_{IN}$ 13.

As shown in FIG. 12, correction operation executor 12 has comparator 40, adder 45, and logic gate 46.

Also, register $B_{IN}$ 13 has registers 41–44 and registers 47–50.

Bus I/F block 3 executes the correction operation using error value (E) and error position (I') input from register $G_{OUT}$ 16.

Binary counter 11 performs operation corresponding to a switch of the output from cache memories 5 and 6 by means of switches 7 and 8. When the binary count value of binary counter 11 is in agreement with one of the structural elements ($i'_n$) of error position (I'), error value en corresponding to logic gate 46 is output to adder 45. Subsequently, in adder 45, for error value $e_n$ and the data output of memory block from switch 8, addition over the Galois field is carried out, and the addition result becomes the output data.

In the following, the decoding operation processing unit 4 will be explained.

FIG. 13 is a diagram illustrating the structure of decoding operation processing unit 4.

As shown in FIG. 13, decoding operation processing unit 4 has microcode ROM 50, sequencer 51, destination control 52, working register 53, GLU (Global Logic Unit) 54, and port selector 55.

For a CIRC code with a t of 4 or smaller, when the solution is derived directly from the simultaneous formulas, and it is acceptable to have a relatively low processing speed, RISC (Reduced Instruction Set Computer) type processing is used as decoding operation processing unit 4.

In decoding operation processing unit 4, the various operations are carried out sequentially, and the operation sets are timeshared at GLU 54. Also, the series of operations are microcoded, stored as instrument codes in microcode ROM 50, and, by means of the ROM address from sequencer 51, the processing routine (memory readout routine) is controlled.

Also, the operation results are temporarily stored in plural working registers 53 prepared beforehand. However, the specific working registers 53 for storing are described in the destination control code in the instruction code.

This method, although there is a restriction on the processing speed, is able to reduce the size of the device by means of the time sharing of GLU 54, and, at the same time, the microcode form of the operation processing can improve the freedom of the design.

For example, the addition of the elements of two Galois fields is equivalent to each bit of an exclusive OR logic operation, and it can be executed in one step in decoding operation processing unit 4. That is, GLU 54 contains the function of an exclusive OR logic operation for each bit. However, multiplication of the Galois field is much more complicated than addition, and when it is performed using ROM, 1 byte of output is obtained for an input of address of 2 bytes. The scale becomes very large.

The configuration of GLU 54 will now be explained.

FIG. 14 is a diagram illustrating the structure of GLU 54.

As shown in FIG. 14, GLU 54 has operation logic 60, 61, converters 62, 63, and operation selector 64.

In GLU 54, the elements of input data (a) and (b) of the Galois field are converted to the corresponding exponent of the original element, that is, conversion from $\alpha^i$ to i in converter 62, and addition of the exponents is carried out. Then, the obtained addition result is converted to the element of the corresponding Galois field in converter 63, that is, i is converted to $\alpha^i$.

For example, when multiplication of $\alpha^v$ and $\alpha^w$ is executed to obtain $\alpha^{v+w}$, in GLU 54, the four operations shown by following Formula 11 are needed, and at least four steps are necessary.

[Formula 1-1]

$$1: v \leftarrow \alpha^v \qquad (11)$$
$$2: w \leftarrow \alpha^w$$
$$3: v + w \leftarrow v, w$$
$$4: \alpha^{v+w} \leftarrow v + w$$

In the same way, division is also performed by performing subtraction of the exponent portion in place of addition of the exponent portion in the case of multiplication.

Consequently, in the aforementioned method, when error values $e_1$–$e_4$ are derived, in said Formulas 3, 4, 6, 7, 9, and 10, multiplication and division are performed in 20 rounds, and in this step alone, 80 or more rounds are needed. In addition, 23 rounds of addition are performed, and a total of 103 or more steps are needed. Consequently, there is no way to meet the demand for high-speed processing.

Also, when t is larger than 4, solving the simultaneous Formulas as shown in said Formula 2 is unrealistic. Consequently, the Euclidian decoding method or another repeating algorithm is adopted.

However, for both multiplication and division of the Galois field, 4 steps are needed, and it is hard to realize high-speed processing.

On the other hand, the demand for speed in the data reproduction of the CD-ROM is now as high as X2 to X12, and the restriction imposed by the processing step number of the error correction becomes more and more severe. In addition, as the reading error of the output system is naturally large, and there is a high demand for strengthening the correction power by means of the aforementioned erasure error correction. That is, it is necessary to realize a higher function in fewer steps.

In order to realize the C1 decoding and C2 decoding corresponding to the X12 reproduction speed, for example, suppose one step of the operation is completed in one clock cycle of 16 MHz, it is necessary to execute each round of decoding of C1 and C2 within 192 steps. Since this condition includes branching processing and other peripheral processing, it is necessary to perform processing of the core of the C2 decoding in less then ¼ the steps.

However, in the conventional constitution, for example, when the dropping error correction is performed in C2 decoding, by performing the correction core processing, 103 or more steps are needed, and it is thus impossible to meet the demand for the high-speed processing.

The purpose of this invention is to solve the aforementioned problems of the conventional technology by providing a type of Reed Solomon decoder which can perform high-speed decoding operation without significantly increasing the circuit scale.

SUMMARY OF THE INVENTION

In order to realize the aforementioned purpose to solve the aforementioned problems, this invention provides a type of Reed Solomon decoder characterized by the following facts: the Reed Solomon decoder has the following means: an input parameter operation means which generates a syndrome and disappearing data for a data sequence, a decoding operation means which performs the decoding operation using the aforementioned syndrome and disappearing data based on the command code indicating the prescribed decoding operation, and which generates the error data and error position data, and a correction operation means which performs the correction operation using the aforementioned error data and error position data; in this Reed Solomon decoder, the aforementioned decoding operation means has an operation processing unit for executing the product and sum operations in a single step for a Galois field.

For the Reed Solomon decoder of this invention, the aforementioned decoding operation means has the following parts: at least a first input port, second input port, and third input port, a multiplier performing multiplication operation for the data input from the aforementioned first input port and the aforementioned second input port, and an adder performing addition for the output data of the aforementioned multiplier and the data input from the aforementioned third input port.

In the Reed Solomon decoder of this invention, data are input to the first input port, second input port, and third input port of the aforementioned decoding operation means; in a multiplier, multiplication operation for the data input from the aforementioned first input port and the aforementioned second input port is performed; then, addition is performed for the output data of the aforementioned multiplier and the data input from the aforementioned third input port in a single step of operation.

Also, for the Reed Solomon decoder of this invention, it is preferred that the aforementioned decoding operation means have the following parts: a first memory means which stores the aforementioned command codes, a sequencer which controls the order of execution of the aforementioned command codes, a second memory means which has plural operation registers for temporary storage of the results of operation of the aforementioned operation processing unit, and a port selecting means which outputs the contents of the aforementioned plural operation registers to the aforementioned first through third input ports of the aforementioned decoding operation means.

Also, for the Reed Solomon decoder of this invention, it is preferred that the aforementioned second memory means store the operation result from the aforementioned operation processing unit in the aforementioned operation register determined corresponding to the aforementioned command code, and the contents stored in the aforementioned plural operation registers be output to any of said first through third input ports by means of the aforementioned port selecting means, respectively.

For the Reed Solomon decoder of this invention, it is preferred that the aforementioned second memory means we shift registers as the aforementioned operation registers and initially store the operation result obtained from the aforementioned operation processing unit in a prescribed operation register. The contents in the aforementioned operation registers can be output to any of the aforementioned first through third input ports by the aforementioned port selecting means, respectively.

Also, for the Reed Solomon decoder of this invention, it is preferred that the aforementioned command code have an operation field and a field which assigns the input port among said first through third input ports of the aforementioned decoding operation means for output of the content stored in the aforementioned plural operation registers.

Also, for the Reed Solomon decoder of this invention, it is preferred the aforementioned decoding operation means have i multipliers, which are multipliers for performing multiplication of the first element $\alpha^w(A_{w,i-1}, A_{w,i-2}, A_{w,i-3}, \ldots, A_{w,3}, A_{w,2}, A_{w,1}, A_{w,0})^T$ and the second element $\alpha^v (A_{v,i-1}, A_{v,i-2}, A_{v,i-3}, \ldots, A_{v,3}, A_{v,2}, A_{v,1}, A_{v,0})^T$ of Galois field GF ($2^i$) and which performs in parallel the multiplier operations for the aforementioned first element and $\alpha^0, \alpha^1, \alpha^2, \alpha^3, \ldots, \alpha^{i-3}, \alpha^{i-2}, \alpha^{i-1}$ of the primitive element $\alpha$ of the aforementioned Galois field, respectively; an AND operation unit which performs in parallel the AND operations for the results of multiplication of said i units of multiplier and said $A_{v,0}, A_{v,1}, A_{v,2}, A_{v,3}, \ldots, A_{v,i-3}, A_{v,i-2}, A_{v,i-1}$; and an adder which performs addition for the results of operation of said i AND operation units.

In addition, for the Reed Solomon decoder of this invention, it is preferred for the aforementioned decoding operation means to have the following parts: i AND operation units which are multipliers that perform multiplication for the first element $$\alpha^w(A_{w,i-1}, A_{w,i-2}, A_{w,i-3}, \ldots, A_{w,3}, A_{w,2}, A_{w,1}, A_{w,0})^T$$

and the second element $$\alpha^v(A_{v,i-1}, A_{v,i-2}, A_{v,i-3}, \ldots, A_{v,3}, A_{v,2}, A_{v,1}, A_{v,0})^T$$

of said Galois field GF ($2^i$), and which performs in parallel the AND operations for said first element and said $$A_{v,0}, A_{v,1}, A_{v,2}, A_{v,3}, \ldots, A_{v,i-3}, A_{v,i-2}, A_{v,i-1}$$

respectively; i multipliers which perform in parallel the multiplier operations for the results of operation of the aforementioned AND operation units and $$\alpha^0, \alpha^1, \alpha^2, \alpha^3, \ldots, \alpha^{i-3}, \alpha^{i-2}, \alpha^{i-1}$$

of primitive element $\alpha$ of said Galois field.

BRIEF DESCRIPTION OF THE DRAWINGS

FIG. 1 is a diagram illustrating the configuration of the multiplier of the Galois field in an embodiment of this invention.

FIG. 2 is a diagram illustrating the configuration of another multiplier of the Galois field in an embodiment of this invention.

FIG. 3 is a diagram illustrating the configuration of the decoding operation processing unit of the Reed Solomon decoder in an embodiment of this invention.

FIG. 4 is a diagram illustrating the configuration of the GLU shown in FIG. 3.

FIG. 5 is a diagram illustrating the configuration of the GF product/sum operation logic and the working register.

FIG. 6 is a diagram illustrating the format of the instruction code shown in FIG. 3.

FIG. 7 is a diagram illustrating another configuration of the working register shown in FIG. 4.

FIG. 8 is a diagram illustrating another format of the instruction code shown in FIG. 3.

FIG. 9 is a diagram illustrating the conventional Reed Solomon decoder.

FIG. 10 illustrates the time sequence states of the data and structural elements in the operation of the Reed Solomon decoder. FIG. 10(A) shows the input data; (B) shows the output data; (C) shows the memory state of register $B_{OUT}$; (D) shows the memory state of register $B_{IN}$; (E) shows the memory state of register $G_{OUT}$; (F) shows the memory storage of register $G_{IN}$; and (G) shows the processing state of the decoding operator.

FIG. 11 is a diagram illustrating the configuration of the input parameter operator and the register shown in FIG. 9.

FIG. 12 is a diagram illustrating the configuration of the correction operation executor and register shown in FIG. 9.

FIG. 13 is a diagram illustrating the configuration of the decoding operation processing unit.

FIG. 14 is a diagram illustrating the configuration of the GLU shown in FIG. 13.

REFERENCE NUMERALS AS USED IN THE DRAWINGS

104 represents a decoding operation processing unit, 150 a microcode, 151 a sequencer, 152, a destination controller, 153 a working register, 154 a GLU, 155 a port selector, 160, 161 operation logic, 162, a GF inversion ROM, 163 a GF product-and-sum operation logic, 164 an operation selector.

DESCRIPTION OF EMBODIMENTS

In the following, the Reed Solomon decoder pertaining to an embodiment of this invention will be explained.

As a direct method for realizing high-speed processing, multiplication and division of the Galois field are realized in a single step. Although it can be realized by ROM, the size of the ROM is very large (a capacity of 64 KB) as pointed out in the above. However, for multiplication, its uniformity is exploited to realize a high-speed multiplier by about 300 gates.

As an example, the case of a Galois field $GF(2^i)$ with $i=8$ is shown.

First of all, the original element of Galois field $(2^8)$ is taken as $\alpha$. The element $\alpha^v$ can be represented by the following Formulas 12 and 13.

$$\alpha^v = \sum_{i=0}^{7} Av, i\alpha^i \tag{12}$$

$$(\alpha^v) = (Av,7 Av,6 \ldots Av,1 Av,0)^T \tag{13}$$

Here, $$A_{v,i} = 0$$

or 1, and v represents any integer. Also, $(\alpha^v)$ represents the row vector expression of element $\alpha^v$, and $$(\ldots)^T$$

represents the transposed matrix.

Here, the multiplication of any elements $\alpha^v$ and $\alpha^w$ of the aforementioned Galois field. From said Formula 13, following Formula 14 is established.

$$\alpha^{v+w} = \alpha^v \cdot \alpha^w = \left\{ \sum_{i=0}^{7} Av \cdot i\alpha^i \right\} \cdot \alpha^w \tag{14}$$

$$= \sum_{i=0}^{7} Av \cdot i\alpha^i \cdot \alpha^w$$

As said Formula 14 is represented by the row vector, the following Formula 15 is obtained.

$$(\alpha^{v+w}) = \sum_{i=0}^{7} Av \cdot i [x\alpha^i](\alpha^w) \tag{15}$$

Here, $[X\alpha^i]$ is an 8×8 matrix corresponding to multiplication of $\alpha^i$. That is, following Formula 16 is established.

$$[x\alpha^i](\alpha^w) = (\alpha^{i+w}) \tag{16}$$

More specifically, from the field-generating polynomial represented by the following Formula 17 of the Galois field of the CIRC code, following Formulas 18 and 19 are established.

$$Gp(x) = x^8 + x^4 + x^3 + x^2 + 1 \tag{17}$$

$$[x\alpha] = \begin{pmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{pmatrix} \tag{18}$$

$$[x\alpha^i] = [x\alpha]^i \tag{19}$$

Figure 1:
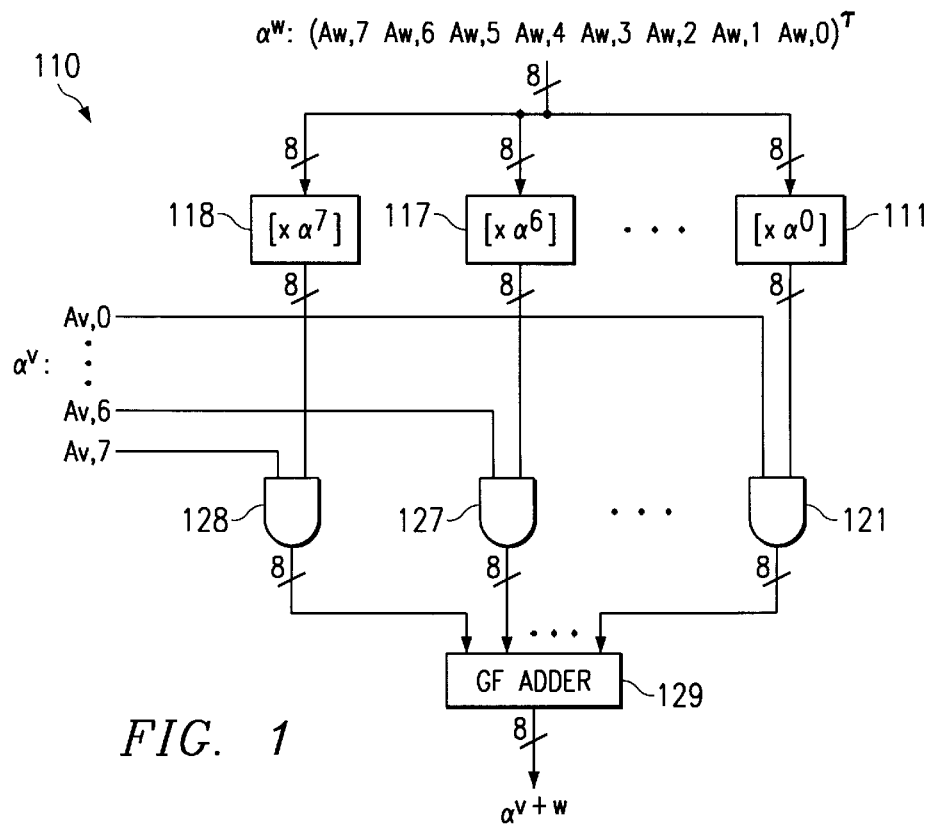
[FIG. 1]

From said Formula 15, the multiplier of the Galois field has the following configuration as shown in FIG. 1. One of two inputs $(\alpha^w, \alpha^v)$ is multiplied with $\alpha^0 - \alpha^7$ by multipliers 111–118, respectively. The other input is gated by AND gates 121–128 to obtain eight 8-byte outputs. They are added (exclusive OR logic operation for each bit) by GF adder 129.

According to said Formulas 18 and 19, the coefficient multipliers corresponding to $[x\alpha^0] \sim [x\alpha^7]$, respectively, can be realized through 3–21 exclusive OR logic operation gates, and the overall multipliers of the Galois field can be realized with about 300 gates. The coefficient multipliers are multipliers with a fixed value.

The delay amount of each multiplier is, say, 10 nsec or less, and it well allows processing in one clock cycle of 16 MHz.

Also, said Formula 15 can be modified to the following Formula 20.

$$(\alpha^{v+w}) = \sum_{i=0}^{7} Av, i [x\alpha i](\alpha^w) \tag{20}$$

-continued $$= \sum_{i=0}^{7} [x\alpha^i](Av, i(\alpha^w))$$

Figure 2:
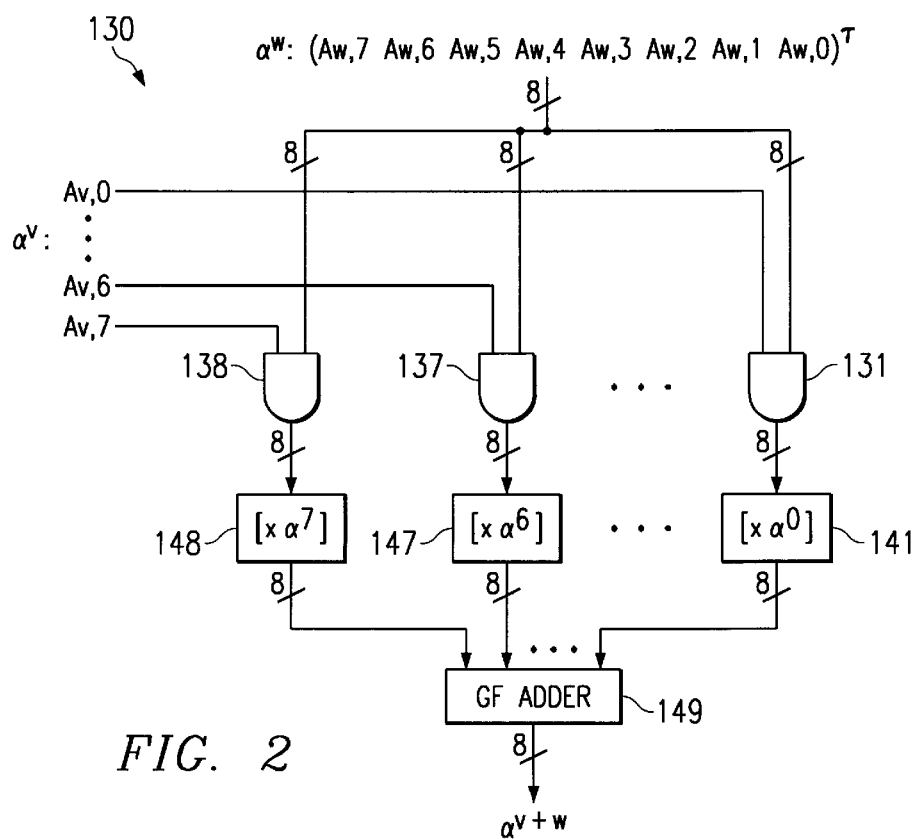
[FIG. 2]

Corresponding to this, the multipliers of the Galois field can have AND gates set on the input side as shown in FIG. 2. That is, the AND for two inputs ($\alpha^w$, $\alpha^v$) is derived by means of AND gates 131–138, and the results are multiplied with $\alpha^0$–$\alpha^7$ by multipliers 141–148, respectively, followed by addition by GF adder 129.

For division of the Galois field, first of all, the inverse element of the divisor is derived, and it is then multiplied with the element of the dividend by the aforementioned multiplier. That is, it requires two steps. When the aforementioned inverse element is derived, it is acceptable to obtain 8-bit output with respect to the 8-bit input. Consequently, it can be realized by means of a ROM having a capacity of 256 bytes. This corresponds to 500 gates, and this has little impact on the circuit scale.

As explained above, by means of an 800-gate circuit, it is possible to perform multiplication of the Galois field in 1 step, and to perform division in 2 steps. In this way, for said Formulas 3, 4, 6, 7, 9, and 10, the 17 rounds of multiplication can be realized in 17 steps, and the 3 rounds of division can be realized in 6 steps. With the 23 rounds (23 steps) of addition included, it is possible to realize the operation in a total of 46 steps.

Although this number of steps is half that of the conventional case, response to the multifunctional request is still insufficient. For example, when it is necessary to make plural uses, such as in the case of no erasure error in audio reproduction and erasure error correction in the case of data reproduction, in order to prevent an increase in the microcodes (the set of instruction codes) stored in the memory, it is necessary for the microcodes to be shared only to enable the formation of subroutines for the common processing. Also, the operation performed by said Formulas 3, 4, 6, 7, 9, and 10 corresponds to the case of quadruple erasure error correction. However, it is also possible to perform triple erasure error correction depending on the number of the erasure symbols. However, the amount of branch processing and other peripheral processings increases, and the number of the steps that can be used in the various correction core processing is limited.

In order to cut the number of steps, the following efforts have been made.

The item of the numerator in said Formula (3) is modified Equation 21 as follows.

$$e4 \leftarrow \frac{s3 + (x1 + x2 + x3) \cdot s2 +}{(x1 \cdot x2 + x2 \cdot x3 + x3 - x1) \cdot s1 + x1 \cdot x2 \cdot x3 \cdot s0} \over (x4 + x1) \cdot (x4 + x2) \cdot (x4 + x3)} \qquad (21)$$

$$= \frac{s3 + x2 \cdot s2 + x1 \cdot (s2 + x2 \cdot s1) + x3 \cdot (s2 + x2 \cdot s1 + x1 - (s1 + x2 \cdot s0))}{(x4 + x1) \cdot (x4 + x2) \cdot (x4 + x3)}$$

Then, by correction of the syndrome, $e_3$ is obtained using said Formula 6, and as shown by the following Formulas 22 and 23, transformation is performed to have the same product/sum operation form.

$s0 \leftarrow s0 + e4$ $s1 \leftarrow s1 + x4 \cdot e4$ $s2 \leftarrow s2 + x4 \cdot (x4 \cdot e4)$ \qquad (22)

$$e3 \leftarrow \frac{s2 + (x1 + x2) \cdot s1 + x1 \cdot x2 \cdot s0}{(x3 + x1) \cdot (x3 + x2)} \qquad (23)$$

$$= \frac{s2 + x2 \cdot s1 + x1 \cdot (s1 + x2 \cdot s0)}{(x3 + x1) \cdot (x3 + x2)}$$

The remaining is unchanged and is represented by the following Formulas 24, 25 and 26.

$s0 \leftarrow s0 + e3$ $s1 \leftarrow s1 + x3 \cdot e3$ \qquad (24)

$$e2 \leftarrow \frac{s1 + x1 \cdot s0}{x2 + x1} \qquad (25)$$

$e1 \leftarrow s0 + e2$ \qquad (26)

Figure 3:
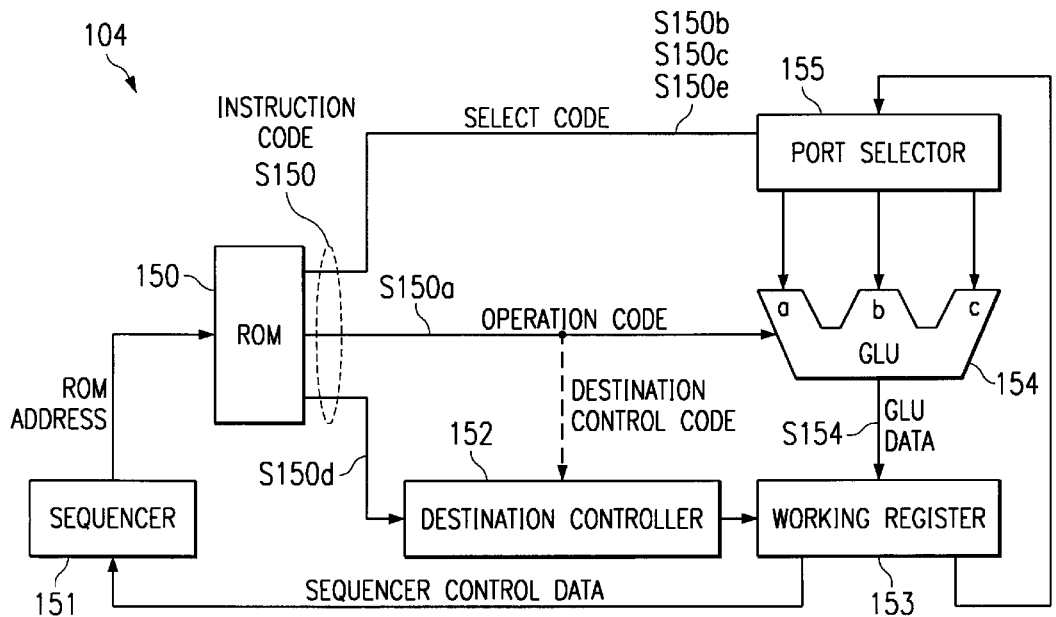
[FIG. 3]
Figure 4:
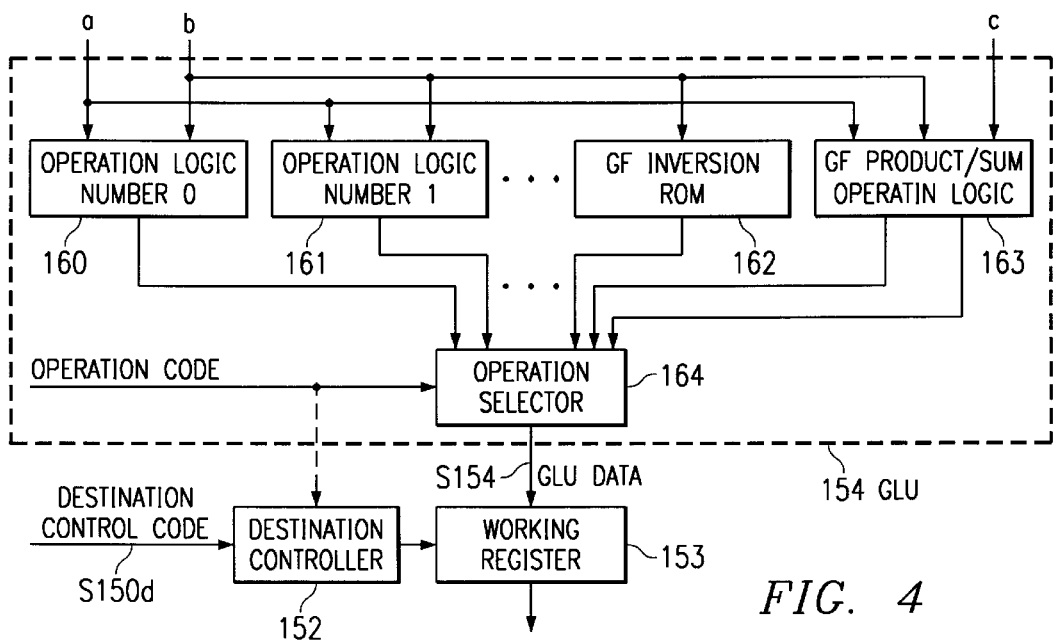
[FIG. 4]

According to said Formulas 21–26, many product-and-sum operations appear. However, as shown in FIG. 3, by using the global logic unit (GLU) as the 3-input product-and-sum operation unit, it is possible to realize each product-and-sum operation in one step. In this case, decoding operation processing unit 104 is shown in FIG. 3, and GLU peripheral structural diagram is shown in FIG. 4 (yet containing the signal indicated by the broken line).

In the following, the constitution of Reed Solomon decoder 101 of this embodiment will be explained in detail.

Figures 8, 9:
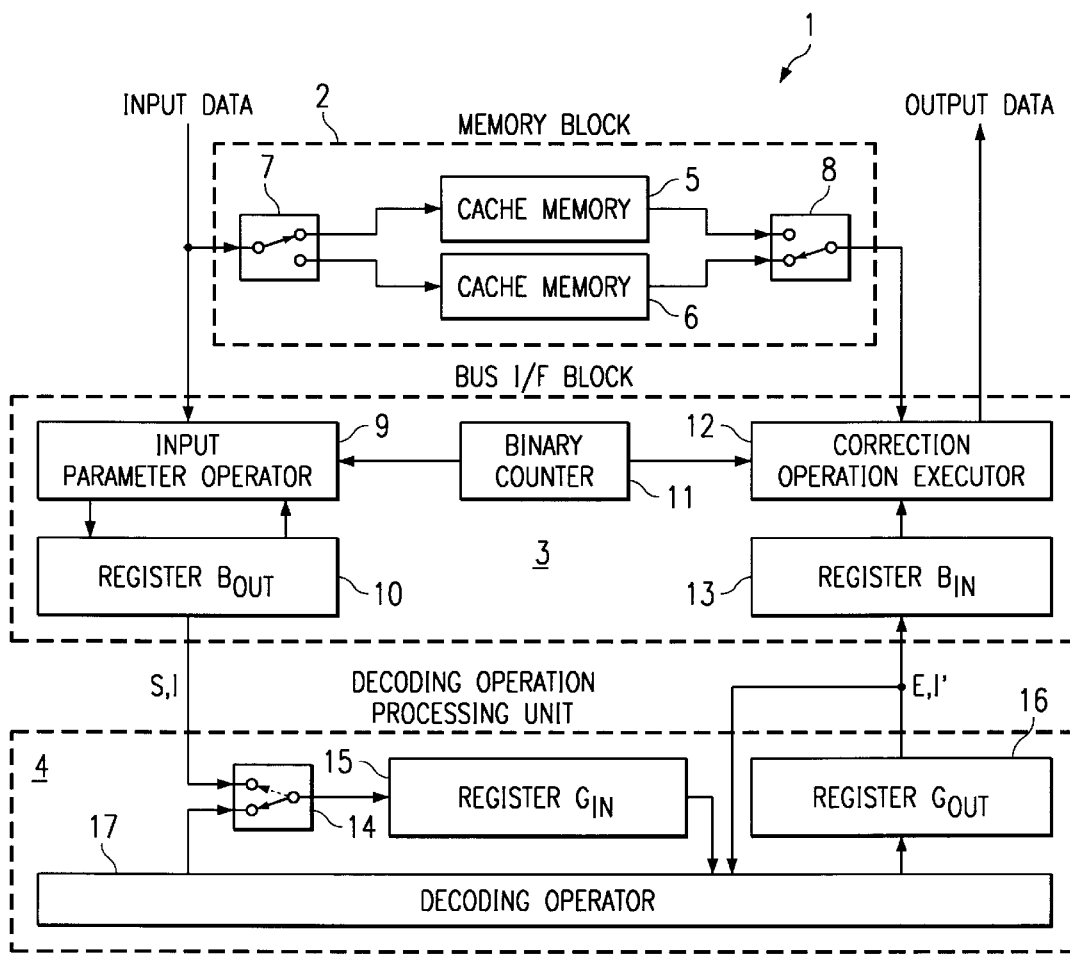
[FIG. 8]
[FIG. 9]
Figure 10:
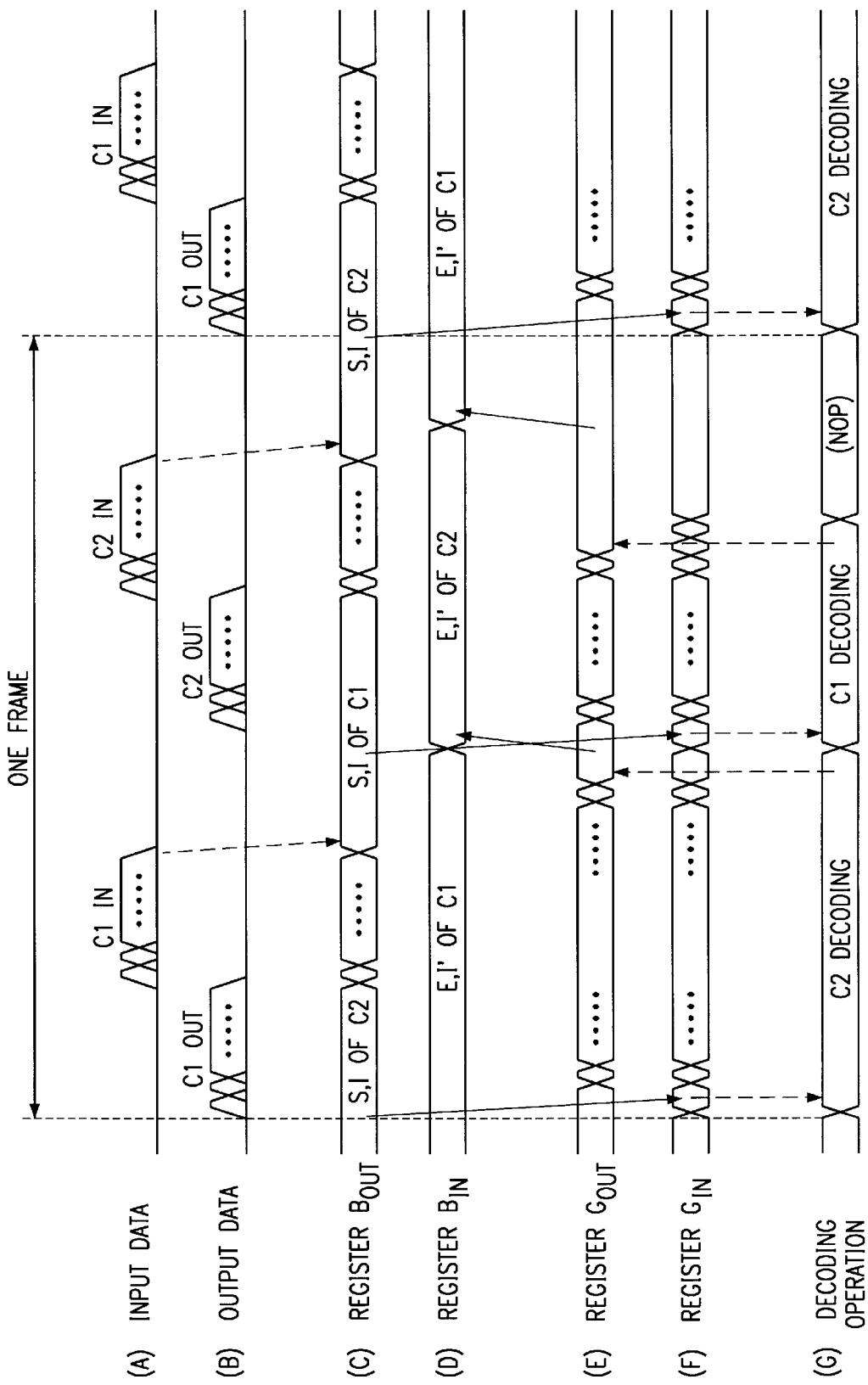
[FIG. 10]
Figure 11:
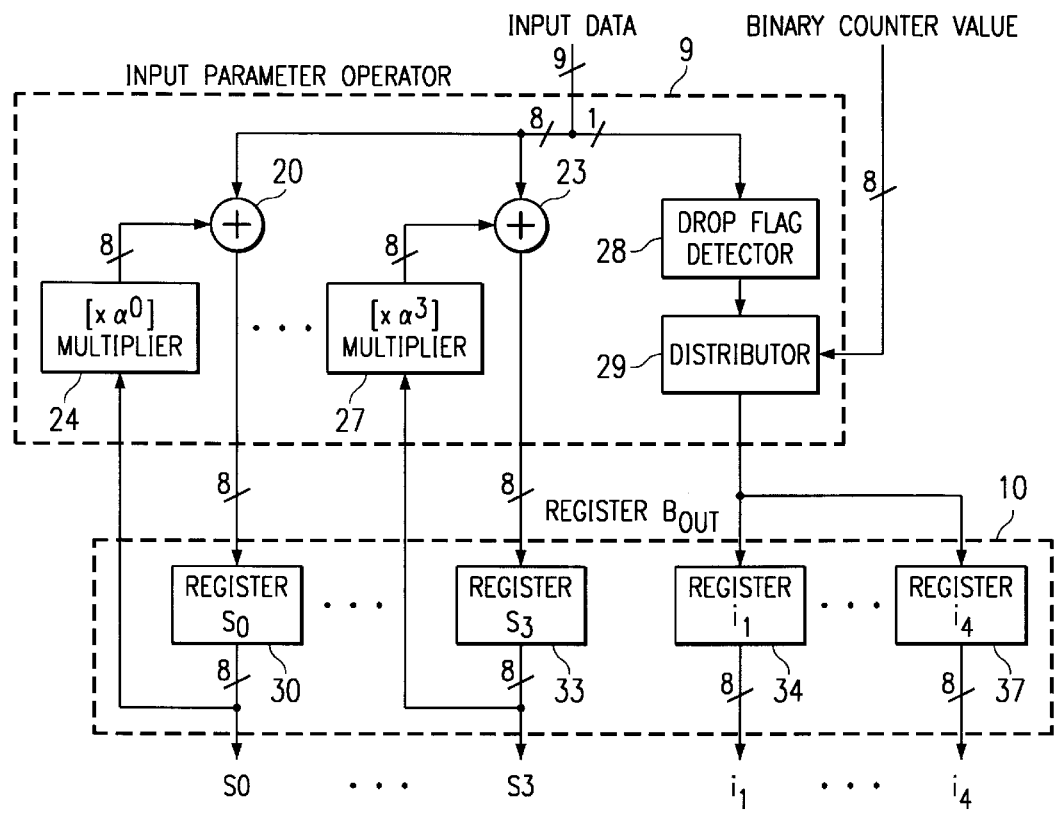
[FIG. 11]
Figure 12:
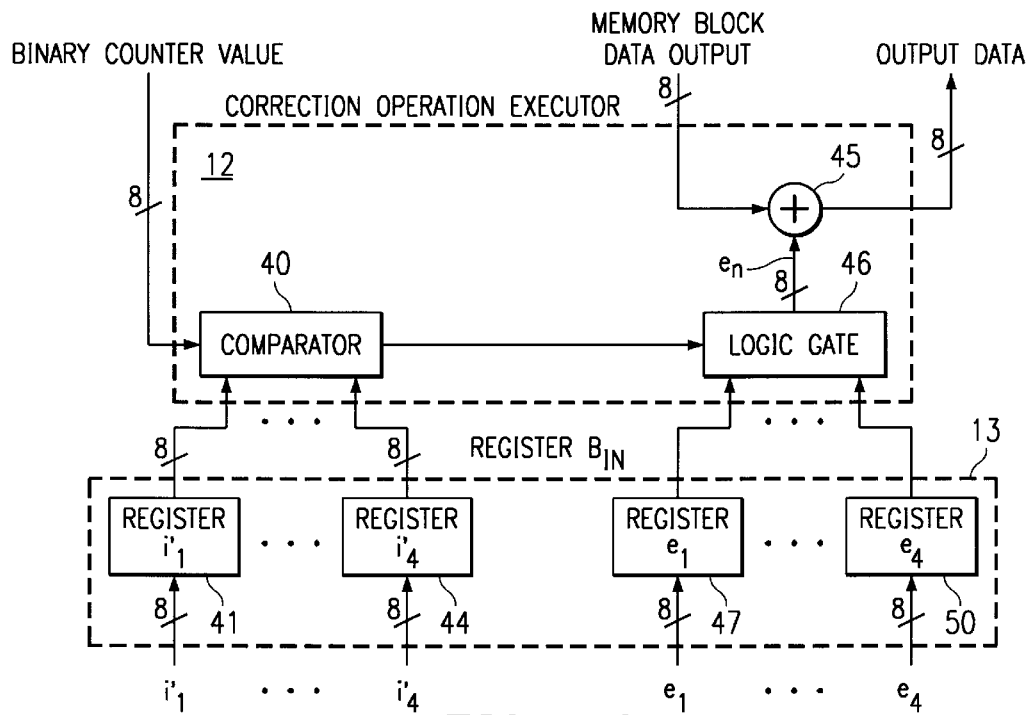
[FIG. 12]
Figure 13:
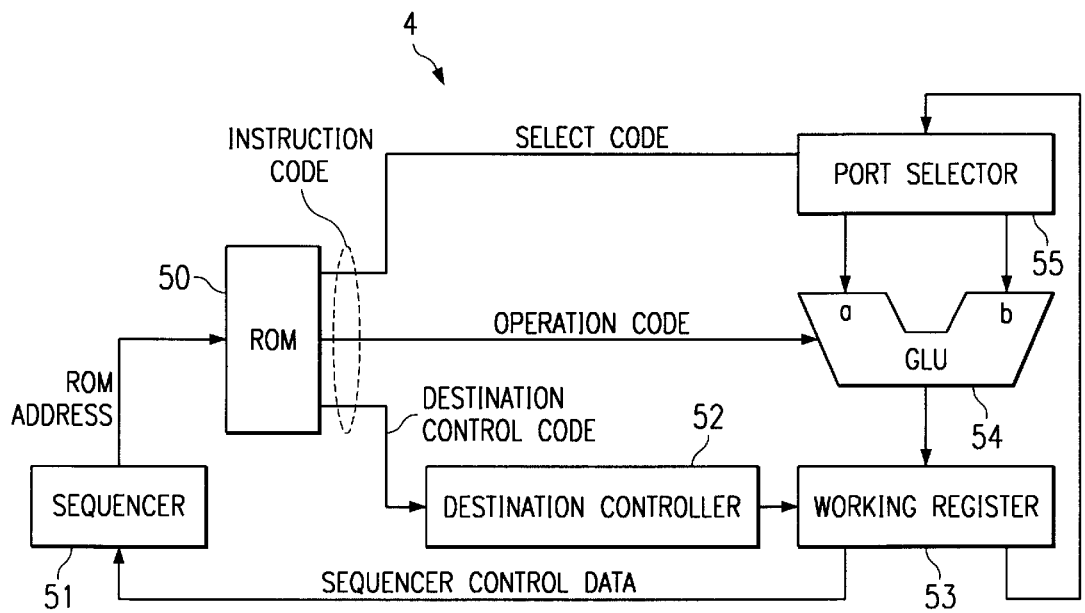
[FIG. 13]
Figure 14:
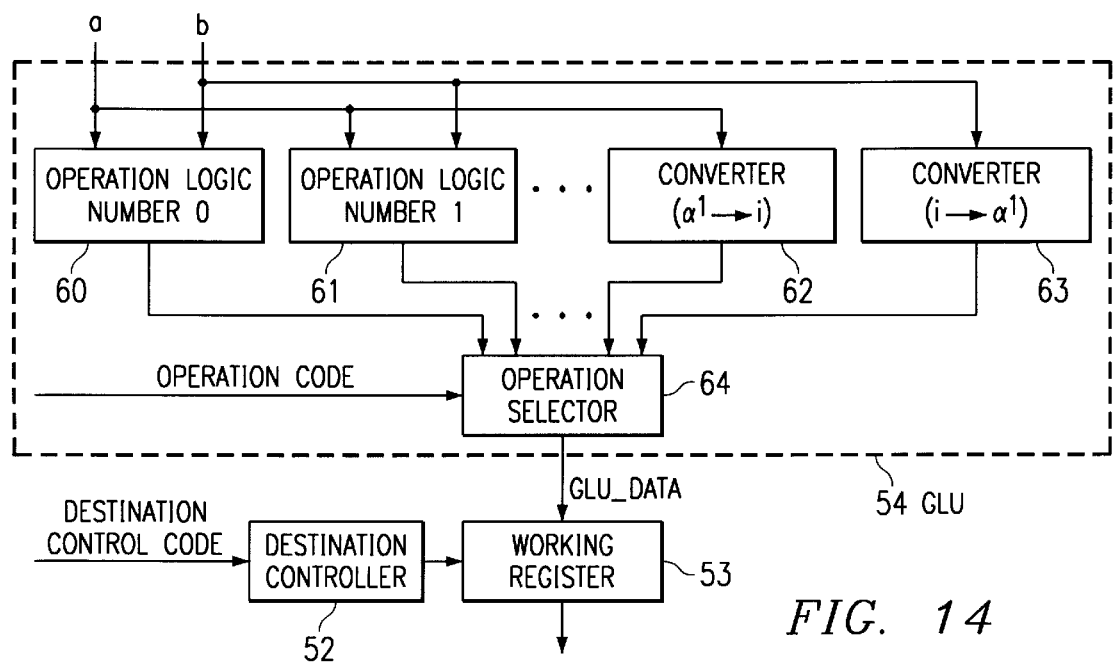
[FIG. 14]

The overall constitution of Reed Solomon decoder 101 is basically identical to the conventional Reed Solomon decoder 1 shown in FIG. 9. However, the decoding operation processing unit of Reed Solomon decoder 101 differs from decoding operation processing unit 4.

FIG. 3 is a diagram illustrating the constitution of decoding operation processing unit 104 of Reed Solomon decoder 101.

As shown in FIG. 3, decoding operation processing unit 104 has microcode ROM 150, sequencer 151, destination controller 152, working register 153, GLU (Global Logic Unit) 154, port selector 155.

For example, an RISC type decoding operation processor may be used as decoding operation processing unit 104.

In decoding operation processing unit 104, the various operations are carried out sequentially, and the operation set is time shared at GLU 154. Also, a series of operation processing is represented by microcodes, which are stored as instruction codes in microcode ROM 150. By means of the ROM address, sequencer 151, the processing order (the order of readout from the memory) is controlled.

Also, the results of midway operation are temporarily stored in plural working register 153. Assignment of the specific working register among working registers 153a, 153b, 153c for storing is described in the destination control code input through destination controller 152.

FIG. 4 is a diagram illustrating the constitution of GLU 154.

As can be seen from FIG. 4, GLU 154 has the following parts: operation logic 160, 161, GF inversion ROM 162, GF product-and-sum logic 163, and operation selector 164.

Here, GF inversion ROM 162 outputs the inverse element of the Galois field of the input (input: $\alpha^1 \rightarrow$ output: $\alpha^{-1}$).

Figure 5:
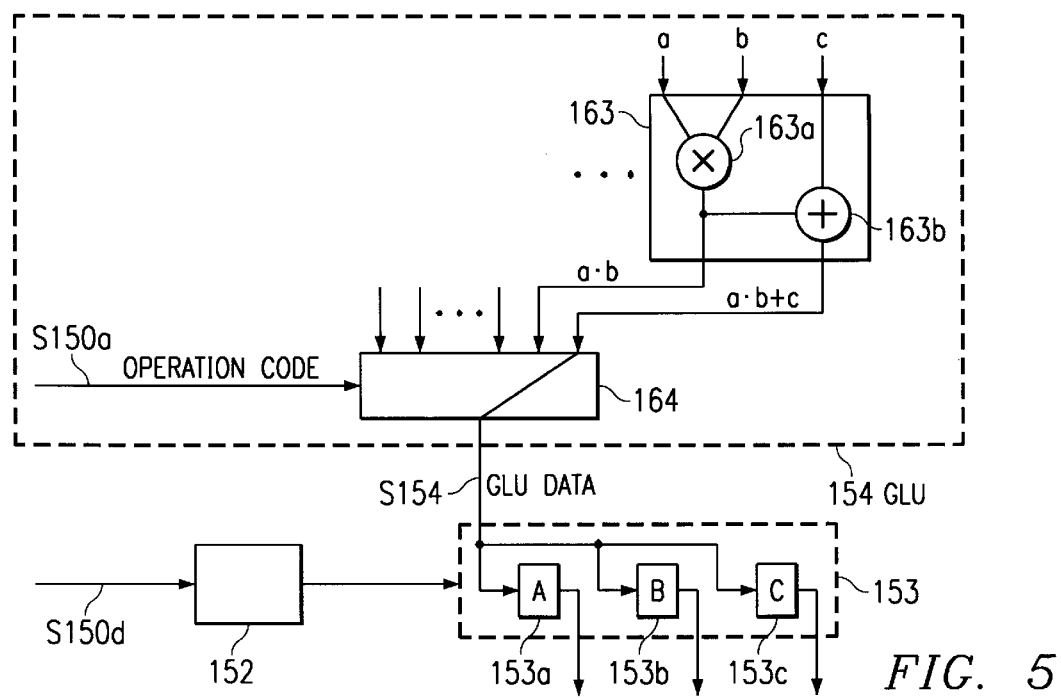
[FIG. 5]

FIG. 5 is a diagram illustrating the constitution of GF product-and-sum logic 163 and working register 153 of GLU 154.

As shown in FIG. 5, GF product-and-sum logic 163 has multiplier 163a and adder 163b. As multiplier 163a, multiplier 110 shown in FIG. 1 or multiplier 130 shown in FIG. 2 is used, and multiplication of Galois field ($2^8$) is realized in a single step.

Also, in working register 153, there are registers 153a, 53b, and 153c.

In each step, operation of the numerator of said Formula 21 is modified as the following Formula 27.

$$
\begin{aligned}
&1: \quad A(s1 + x2 \cdot s0) && \leftarrow s1, && x2, \ s0 \\
&2: \quad B(s2 + x2 \cdot s1) && \leftarrow s2, && x2, \ s1 \\
&3: \quad C(s2 + x2 \cdot s1 + x1 \cdot (s1 + x2 \cdot s0)) && \leftarrow B(s2 + x2 \cdot s1)) && x1, \ A(s1 + x2 \cdot s0) \\
&4: \quad A(s3 + x2 \cdot s2) && \leftarrow s3, && x2, \ s2 \\
&5: \quad A(s3 + x2 \cdot s2 + x1 \cdot (s2 + x2 \cdot s1)) && \leftarrow A(s3 + x2 \cdot s2), && x1 \quad B(s2 + x2 \cdot s1) \\
&6: \quad A(s3 + x2 \cdot s2 + x1 \cdot (s2 + x2 \cdot s1) + && \leftarrow A(s3 + x2 \cdot s2 + x1 \cdot (s2 + x2 \cdot s1)) && x3, \ C(s2 + x2 \cdot s1 + x1 \cdot (s1 + x2 \cdot s0)) \\
&\quad \quad x3 \cdot (s2 + x2 \cdot s1 + x1 \cdot (s1 + x2 \cdot s0))
\end{aligned} \quad (27)
$$

Here, A–C represent registers 153a, 153b, and 153c in working register 153, and A(z) represents that the content of register 153a is "z." Also, the time on the input side on the right on the time of the 1 step prior to the output side on the left. The three values on the right in each step are the input signals of ports c, b and a of GLU 154. For example, in first step (1:), "$s_1$" is input to port c, "$x^2$" is input to port b, and "$s_0$" is input to port a.

Based on the destination control code, destination controller 152 controls which registers 153a, 153b, and 153c in working register 153 is assigned for storing GLU data S154 from GLU 154. For example, in first step (1:) of said Formula 27, "$s_1 + x_2 \cdot s_0$"

as GLU data S154 are stored in register 153a.

In this way, the operation of the numerator in said Formula 21 can be executed by 6 rounds of product-and-sum operation, and the remaining is subjected to 3 rounds of addition, 2 rounds of multiplication, and 1 round of division to derive said error value $e_4$.

Also, correction of the syndrome of said Formula 22 also can be executed by 2 rounds of the product-and-sum operation, 1 round of addition, and 1 round of multiplication.

Similarly, the operation of said Formula 23 is executed by 3 rounds of the product-and-sum operation, 2 rounds of addition, 1 round of multiplication, and 1 round of division. Then, correction of the syndrome of said Formula 24 is performed by 1 round of the product-and-sum operation and 1 round of addition.

In addition, for said Formula 25, 1 round of the product-and-sum operation, 1 round of addition, and 1 round of division are executed. Then, for said Formula 26, 1 round of addition is performed.

In this way, the quadruple dropping error correction of the C2 code is executed by 13 rounds of product-and-sum operation, 9 rounds of addition, 4 rounds of multiplication, and 3 rounds of division. That is, the total number of steps is 13+9+4+3×2=32. That is, the operation can be realized in less than ⅓ steps of the conventional method.

In the following, instruction code S150 shown in FIG. 3 will be explained.

Figure 6:
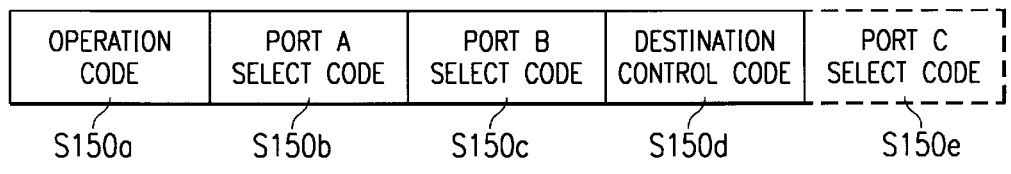
[FIG. 6]

FIG. 6 is a diagram illustrating the format of instruction code S150.

For multiplication, addition, and division (or multiplication after deriving the inverse element), there are two or less inputs. Consequently, instruction code S150 is made of 4 fields (solid line in FIG. 6. That is, instruction code S150 contains in each field the following codes: operation code S150a which assigns the specific type of operation GLU 154 is to execute, port a select code S150b and port b select code S150c which assign the signals to be input to the two input ports (port a and port b in this example), and destination control code S150d which assigns the register of working register 153 for input of GLU data S154. For example, suppose each of said four fields comprises 4 bits, it is able to assign up to 16 operations, 16 input elements and 16 output elements, respectively.

In GLU 154 containing GF product-and-sum logic 163 shown in FIG. 5, it is necessary to select three inputs, and there are three input select fields only for the product-and-sum operation. As indicated by the broken line in FIG. 6, four more bits are needed to assign the third input port (taken as port c) as indicated by the broken line shown in FIG. 6), so that there are in all 20 bits in 5 fields for instruction code S150. However, since the input select field of port c is used only in the product-and-sum operation, there is a waste and the result is not economical.

Figure 7:
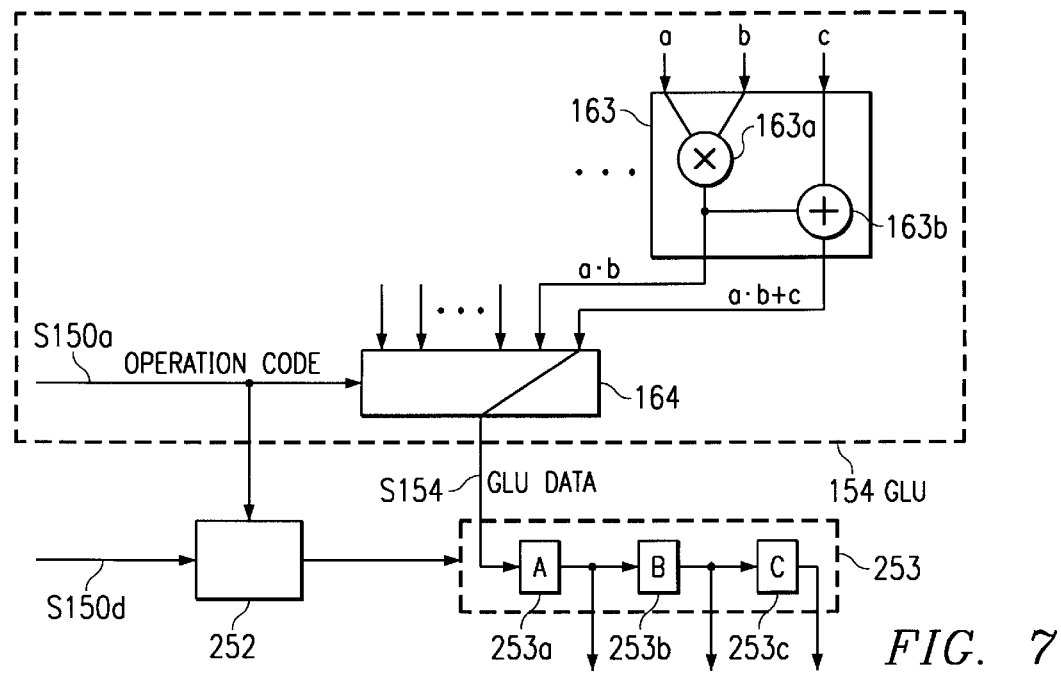
[FIG. 7]

Destination controller 252 and working register 253 shown in FIG. 7 are for improving the aforementioned economy. When the operation code assigns the product-and-sum operation, destination controller 252 controls working register 253 so that GLU data S154 from GLU 154 are stored and fixed in register 253a. In this way, there is no need to control the output destination of data S154 of GLU 154. Consequently, there is no need to have the destination control code. In this way, as shown in FIG. 8, it is possible to set port c select code in place of the destination control code only in the case of the product-and-sum operation. That is, as shown in FIG. 8, it is possible to allocate in a time division form the destination control code and port c select code. As a result, it is possible to prepare instruction code S150 only for 4 fields, and there is no increase in the bit number of the instruction code. Consequently, it is possible to prevent the scale of the circuit from becoming larger.

Also, when an operation other than the product-and-sum operation is assigned, if registers 253a, 253b, and 253c of working register 253 are controlled by the destination control code, it is possible to use registers 253a, 253b, and 253c as the conventional working registers.

In this case, as shown in FIG. 3, decoding operation processing unit 104 includes control by the signal indicated by the broken line, that is, control of destination controller 152 by operation code S150a.

In addition, as shown in FIG. 7, in consideration of the fact that the product-and-sum operation may be continued, registers 253a, 253b and 253c are made of shift registers.

In the following, for use of the constitution shown in FIG.s 7 and 8, the specific signal flow will be explained with respect to the operation of the numerator of said Formula 21.

In this case, the signal flow is represented by the following Formula 28.

[Formula 2-8]

(28)

$$
\begin{aligned}
&1: & A(s1+x2\cdot s0) &\leftarrow s1, & x2,\ s0 \\
& & B(.) &\leftarrow A(.) \\
& & C(.) &\leftarrow B(.) \\
&2: & A(s2+x2\cdot s1) &\leftarrow s2, & x2,\ s1 \\
& & B(s1+x2\cdot s0) &\leftarrow A(s1+2\cdot s0) \\
& & C(.) &\leftarrow B(.) \\
&3: & A(s2+x2\cdot s1+x1\cdot(s1+x2\cdot s0)) &\leftarrow A(s2+x2\cdot s1), & x1,\ B(s1+x2\cdot s0) \\
& & B(s2+x2\cdot s1) &\leftarrow A(s2+x2\cdot s1) \\
& & C(s1+x2\cdot s0) &\leftarrow B(s1+x2\cdot s0) \\
&4: & A(s3+x2\cdot s2) &\leftarrow s3, & x2,\ s2 \\
& & B(s2+x2\cdot s1+x1\cdot(s1+x2\cdot s0)) &\leftarrow A(s2+x2\cdot s1+x1\cdot(s1+x2\cdot s0)) \\
& & C(s2+x2\cdot s1) &\leftarrow B(s2+x2\cdot s1) \\
&5: & A(s3+x2\cdot s2+x1\cdot(s2+x2\cdot s1)) &\leftarrow A(s3+x2\cdot s2), & x1,\ C(s2+x2\cdot s1) \\
& & B(s3+x2\cdot s2) &\leftarrow A(s3+x2\cdot s2) \\
& & C(s2+x2\cdot s1+x1\cdot(s1+x2\cdot s0)) &\leftarrow B(s2+x2\cdot s1+x1\cdot(s1+x2\cdot s0)) \\
&6: & A(s3+x2\cdot s2+x1\cdot(s2+x2\cdot s1)+ &\leftarrow A(s3+x2\cdot s2+x1\cdot(s2+x2\cdot s1))\ \ x3,\ \ C(s2+x2\cdot s1+x1\cdot(s1+x2\cdot s0)) \\
& & \quad x3\cdot(s2+x2\cdot s1+x1\cdot(s1+x2\cdot s0))) \\
& & B(.) &\leftarrow A(s3+x2\cdot s2+x1\cdot(s2+x2\cdot s1)) \\
& & C(.) &\leftarrow B(s3+x2\cdot s2)
\end{aligned}
$$

Here, (·) indicates that the content is omitted. In each step, three treatments are performed at the same time, and the time system on the right is the time 1 step ahead of that on the output side the left. Also, the three values on the right of the initial row in each step are the port input signals of ports c, b and a of GLU 154, respectively.

In this way, the operation of the numerator of said Formula 21 can be executed in 6 steps in this embodiment, and it is possible to realize the aforementioned quadruple erasure error correction in a total number of steps of 32.

Various modifications are allowed for this embodiment. More specifically, it is believed that there are various modifications that can be made for said Formula 20. For example, modification allows that shown in the following Formula 29.

[Formula 29]

$$
\begin{aligned}
e4 &= \frac{s3+(x1+x2+x3)\cdot s2 + (x1\cdot x2+x2\cdot x3+x3\cdot x1)\cdot s1+x1\cdot x2\cdot x3\cdot s0}{(x4+x1)\cdot(x4+x2)\cdot(x4+x3)} \\
&= \frac{s3+x1\cdot s2+x2\cdot(s2+x1\cdot s1)+x3\cdot(s2+x1\cdot s1+x2\cdot(s1+x1\cdot s0))}{(x4+x1)\cdot(x4+x2)\cdot(x4+x3)}
\end{aligned}
$$
(29)

In this case also, the same product-and-sum operation circuit may be adopted. Also, in the present embodiment, derivation from $e_4$ is performed. However, it is also possible to obtain from the other error values in order. In addition, as shown in FIG. 3, the inverse element operation of the Galois field is performed in ROM. However, it is also possible to use a logic circuit to construct it.

Also, this invention is not limited to CIRC code. It is not limited to erasure error correction, and can be used in the general RS decoders containing the product-and-sum operation.

As explained in the above, by means of Reed Solomon decoder 101, the product-and-sum operation can be performed in a single step, and it is possible to use ROM 150 on a relatively small scale with correction processing carried out in a shorter time.

Also, for Reed Solomon decoder 101, by adopting the configuration shown in FIG. 7 and the format of instruction code S150 shown in FIG. 8, it is possible to reduce the number of bits of instruction code S150, and this can effectively increase the scale of the circuit.

As explained in the above, the Reed Solomon decoder of this invention can perform high-speed decoding operation without significantly increasing the circuit scale.

What is claimed is:

1. A Reed Solomon decoder comprising:
   an input parameter operation means which generates a syndrome and erasure data for a data sequence,
   a decoding operation means which performs a decoding operation using the syndrome and erasure data based on a command code indicating a prescribed decoding operation, and which generates error data and error position data,
   and a correction operation means which performs a correction operation using the error data and error position data;
   the decoding operation means has an operation processing unit for executing product-and-sum operations in a single step in the Galois field, and wherein the command code has an operation field and a field indicating the specific input port among said first through third input ports of the plural decoding operation means for outputting the contents stored in the aforementioned plural operation registers.

2. The Reed Solomon decoder described in claim 1 wherein the decoder has the following parts: i multipliers, which are multipliers for performing multiplication of the first element $\alpha^w(A_{w, i-1}, A_{w, i-2}, A_{w, i-3}, \ldots, A_{w, 3}, A_{w, 2}, A_{w, 1}, A_{w, 0})^T$ and the second element $\alpha^v(A_{v, i-1}, A_{v, i-2}, A_{v, i-3}, \ldots, A_{v, 3}, A_{v, 2}, A_{v, 1}, A_{v, 0})^T$, of Galois field GF $(2^i)$ and which performs in parallel the multiplier operations for the first element and $\alpha^0, \alpha^1, \alpha^2, \alpha^3, \ldots, \alpha^{i-3}, \alpha^{i-2}, a^{i-1}$ of the primitive element $\alpha$ of the Galois field, respectively; an AND operation unit which performs in parallel the AND operations for the results of multiplication of said i units of multiplier and said $A_{v, 0}, A_{v, 1}, A_{v, 2}, A_{v, 3}, \ldots, A_{v, i-3}, A_{v, i-2}, A_{v, i-1}$; and an adder which performs addition for the results of operation of said i AND operation units.

3. The Reed Solomon decoder described in claim 1 wherein the decoding operation means has the following parts:

at least a first input port, second input port, and third input port, a multiplier performing multiplication operation for the data input from the first input port and the second input port, and an adder performing addition for the output data of the multiplier and the data input from the third input port.

4. The Reed Solomon decoder described in claim 3 wherein the decoder has the following parts: i multipliers, which are multipliers for performing multiplication of the first element $\alpha^w(A_{w, i-1}, A_{w, i-2}, A_{w, i-3}, \ldots, A_{w, 3}, A_{w,2}, A_{w, 1}, A_{w, 0})^T$ and the second element $\alpha^v(A_{v, i-1}, A_{v, i-2}, A_{v, i-3}, \ldots, A_{v, 3}, A_{v, 2}, A_{v, 1}, A_{v, 0})^T$, of Galois field GF $(2^i)$ and which performs in parallel the multiplier operations for the first element and $\alpha^0, \alpha^1, \alpha^2, \alpha^3, \ldots, \alpha^{i-3}, \alpha^{i-2}, a^{i-1}$ of the primitive element $\alpha$ of the Galots field, respectively; an AND operation unit which performs in parallel the AND operations for the results of multiplication of said i units of multiplier and said $A_{v, 0}, A_{v, 1}, A_{v, 2}, A_{v, 3}, \ldots, A_{v, i-3}, A_{v, i-2}, A_{v, i-1}$; and an adder which performs addition for the results of operation of said i AND operation units.

5. The Reed Solomon decoder described in claim 3 wherein the decoding operation means has the following parts:

a first memory means which stores the command codes, a sequencer which controls the order of execution of the command codes, a second memory means which has plural operation registers for temporary storage of the results of operation of the operation processing unit, and a port selecting means which outputs the contents of the plural operation registers to the first through third input ports of the decoding operation means.

6. The Reed Solomon decoder described in claim 5 wherein the decoder has the following parts: i multipliers, which are multipliers for performing multiplication of the first element $\alpha^w(A_{w, i-1}, A_{w, i-2}, A_{w, i-3}, \ldots, A_{w, 3}, A_{w, 2}, A_{w, 1}, A_{w, 0})^T$ and the second element $\alpha^v(A_{v, i-1}, A_{v, i-2}, A_{v, i-3}, \ldots, A_{v, 3}, A_{v, 2}, A_{v, 1}, A_{v, 0})^T$, of Galois field GF $(2^i)$ and which performs in parallel the multiplier operations for the first element and $\alpha^0, \alpha^1, \alpha^2, \alpha^3, \ldots, \alpha^{i-3}, \alpha^{i-2}, a^{i-1}$ of the primitive element $\alpha$ of the Galois field, respectively; an AND operation unit which performs in parallel the AND operations for the results of multiplication of said i units of multiplier and said $A_{v, 0}, A_{v, 1}, A_{v, 2}, A_{v, 3}, \ldots, A_{v, i-3}, A_{v, i-2}, A_{v, i-1}$; and an adder which performs addition for the results of operation of said i AND operation units.

7. The Reed Solomon decoder described in claim 1 wherein the decoding operation means has the following parts:

a first memory means which stores the command codes, a sequencer which controls the order of execution of the command codes, a second memory means which has plural operation registers for temporary storage of the results of operation of the operation processing unit, and a port selecting means which outputs the contents of the plural operation registers to the first through third input ports of the decoding operation means.

8. The Reed Solomon decoder described in claim 7 wherein the decoder has the following parts: i multipliers, which are multipliers for performing multiplication of the first element $\alpha^w(A_{w, i-1}, A_{w, i-2}, A_{w, i-3}, \ldots, A_{w, 3}, A_{w,2}, A_{w, 1}, A_{w, 0})^T$ and the second element $\alpha^v(A_{v, i-1}, A_{v, i-2}, A_{v, i-3}, \ldots, A_{v, 3}, A_{v, 2}, A_{v, 1}, A_{v, 0})^T$, of Galois field GF $(2^i)$ and which performs in parallel the multiplier operations for the first element and $\alpha^0, \alpha^1, \alpha^2, \alpha^3, \ldots, \alpha^{i-3}, \alpha^{i-2}, a^{i-1}$ of the primitive element $\alpha$ of the Galois field, respectively; an AND operation unit which performs in parallel the AND operations for the results of multiplication of said i units of multiplier and said $A_{v, 0}, A_{v, 1}, A_{v, 2}, A_{v, 3}, \ldots, A_{v, i-3}, A_{v, i-2}, A_{v, i-1}$; and an adder which performs addition for the results of operation of said i AND operation units.

9. The Reed Solomon decoder described in claim 7 wherein:

the second memory means stores the operation result from the operation processing unit in the operation register determined to be corresponding to the command code;

the contents stored in the plural operation registers being output to any of said first through third input ports by means of the port selecting means, respectively.

10. The Reed Solomon decoder described in claim 9 wherein the decoder has the following parts: i multipliers, which are multipliers for performing multiplication of the first element $\alpha^w(A_{w, i-1}, A_{w, i-2}, A_{w, i-3}, \ldots, A_{w, 3}, A_{w, 2}, A_{w, 1}, A_{w, 0})^T$ and the second element $\alpha^v(A_{v, i-1}, A_{v, i-2}, A_{v, i-3}, \ldots, A_{v, 3}, A_{v, 2}, A_{v, 1}, A_{v, 0})^T$, of Galois field GF $(2^i)$ and which performs in parallel the multiplier operations for the first element and $\alpha^0, \alpha^1, \alpha^2, \alpha^3, \ldots, \alpha^{i-3}, \alpha^{i-2}, \alpha^{i-1}$ of the primitive element $\alpha$ of the Galois field, respectively; an AND operation unit which performs in parallel the AND operations for the results of multiplication of said i units of multiplier and said $A_{v, 0}, A_{v, 1}, A_{v, 2}, A_{v, 3}, \ldots, A_{v, i-3}, A_{v, i-2}, A_{v, i-1}$; and an adder which performs addition for the results of operation of said i AND operation units.

11. The Reed Solomon decoder described in claim 9 wherein:

the second memory means makes use of the plural operation registers as the shift registers and initially stores the operation result from the operation processing unit in the prescribed operation register;

the contents stored in the plural operation registers can be output to any of said first through third input ports by means of the port selecting means, respectively.

12. The Reed Solomon decoder described in claim 11 wherein the decoder has the following parts: i multipliers, which are multipliers for performing multiplication of the first element $\alpha^w(A_{w,\,i-1}, A_{w,\,i-2}, A_{w,\,i-3}, \ldots, A_{w,\,3}, A_{w,\,2}, A_{w,\,1}, A_{w,\,0})^T$ and the second element $\alpha^v(A_{v,\,i-1}, A_{v,\,i-2}, A_{v,\,i-3}, \ldots, A_{v,\,3}, A_{v,\,2}, A_{v,\,1}, A_{v,\,0})^T$, of Galois field GF $(2^i)$ and which performs in parallel the multiplier operations for the first element and $\alpha^0, \alpha^1, \alpha^2, \alpha^3, \ldots, \alpha^{i-3}, \alpha^{i-2}, a^{i-1}$ of the primitive element $\alpha$ of the Galois field, respectively; an AND operation unit which performs in parallel the AND operations for the results of multiplication of said i units of multiplier and said $A_{v,\,0}, A_{v,\,1}, A_{v,\,2}, A_{v,\,3}, \ldots, A_{v,\,i-3}, A_{v,\,i-2}, A_{v,\,i-1}$; and an adder which performs addition for the results of operation of said i AND operation units.

13. A Reed Solomon decoder further comprising:

an input parameter operation means which generates a syndrome and erasure data for a data sequence, a decoding operation means which performs the decoding operation using the syndrome and erasure data based on the command code indicating the prescribed decoding operation, and which generates the error data and error position data, and a correction operation means which performs the correction operation using the error data and error position data;

the decoding operation means has an operation processing unit for executing product-and-sum operations in a single step in the Galois field; and wherein the decoder has the following parts: i AND operation units which are multipliers that perform multiplication for the first element $\alpha^w(A_{w,\,i-1}, A_{w,\,i-2}, A_{w,\,i-3}, \ldots, A_{w,\,3}, A_{w,\,2}, A_{w,\,1}, A_{w,\,0})^T$ and the second element $\alpha^v(A_{v,\,i-1}, A_{v,\,i-2}, A_{v,\,i-3}, \ldots, A_{v,\,3}, A_{v,\,2}, A_{v,\,1}, A_{v,\,0})^T$ of said Galois field GF $(2^i)$, and which performs in parallel the AND operations for said first element and said $A_{v,\,0}, A_{v,\,1}, A_{v,\,2}, A_{v,\,3}, \ldots, A_{v,\,i-3}, A_{v,\,i-2}, A_{v,\,i-1}$, respectively; i multipliers which perform in parallel the multiplier operations for the operation results of the AND operation units and $\alpha^0, \alpha^1, \alpha^2, \alpha^3, \ldots, \alpha^{i-3}, \alpha^{i-2}, a^{i-1}$ of primitive element $\alpha$ of said Galois field.

14. The Reed Solomon decoder described in claim 13 wherein the decoding operation means has the following parts:

at least a first input port, second input port, and third input port, a multiplier performing multiplication operation for the data input from the first input port and the second input port, and an adder performing addition for the output data of the multiplier and the data input from the third input port.

15. The Reed Solomon decoder described in claim 14 wherein the decoding operation means has the following parts:

a first memory means which stores the command codes, a sequencer which controls the order of execution of the command codes, a second memory means which has plural operation registers for temporary storage of the results of operation of the operation processing unit, and a port selecting means which outputs the contents of the plural operation registers to the first through third input ports of the decoding operation means.

16. The Reed Solomon decoder described in claim 15, wherein the second memory means stores the operation result from the operation processing unit in the operation register determined corresponding to the command code; and the contents stored in the plural operation registers can be output to any of said first through third input ports by means of the port selecting means, respectively.

17. The Reed Solomon decoder described in claim 16 wherein the second memory means makes use of the plural operation registers as the shift registers and initially stores the operation result from the operation processing unit in the prescribed operation register; and the contents stored in the plural operation registers being output to any of said first through third input ports by means of the port selecting means, respectively.

18. The Reed Solomon decoder described in claim 17 wherein the command code has an operation field and a field indicating the specific input port among said first through third input ports of the plural decoding operation means for outputting the contents stored in the aforementioned plural operation registers.

* * * * *